United States Patent [19]

Kitamura et al.

[11] Patent Number: 4,649,407
[45] Date of Patent: Mar. 10, 1987

[54] CHARGE COUPLED DEVICE FOR TRANSFERRING ELECTRIC CHARGE

[75] Inventors: Yuji Kitamura; Nobuhiro Mitani, both of Gifu, Japan

[73] Assignee: Sanyo Electric Co., Ltd., Japan

[21] Appl. No.: 698,617

[22] Filed: Feb. 6, 1985

[30] Foreign Application Priority Data

Feb. 8, 1984 [JP] Japan .................. 59-22095

[51] Int. Cl.$^4$ ...................... H01L 29/78; G11C 19/28
[52] U.S. Cl. ............................. 357/24; 377/62
[58] Field of Search .............. 357/24; 377/57-63

[56] References Cited

U.S. PATENT DOCUMENTS

| | | | |
|---|---|---|---|
| 3,735,156 | 5/1973 | Krambeck | 357/24 |
| 3,967,306 | 6/1976 | Bower | 357/24 |
| 4,032,952 | 6/1977 | Ohba et al. | 357/24 |

OTHER PUBLICATIONS

Hobson *Charge-Transfer Devices* Edward Arnold, London 1978, pp. 20–27.
Hynecek "Virtual Phase Technology..." IEEE Trans. Electron Devices vol. ED-28 (5/81), pp. 483–489.
Hosack "Aperature Response and Optical Performance of Patterned-Electrode Virtual-Phase Imagers IEEE Trans. Electron Devices, vol. ED-28 (1/81), pp. 53–63.
Hynecek "Virtual Phase Technology" IEEE Int. Electron Devices Meeting (12/79), Tech. Dig., pp. 611–614.
Hynecek "Electron-Hole Recombination Antiblooming for Virtual-Phase CCD Imager" IEEE Trans. Electron Devices vol. ED-30 (8/83), pp. 941–948.
Lineback "Clocking Technique Simplifies Structure of Image-Sensing CCD's" Electronics (Jan. 27, 1982), pp. 39–40.

*Primary Examiner*—Gene Manson
*Attorney, Agent, or Firm*—Darby & Darby

[57] ABSTRACT

An insulating film O is formed on a semiconductor substrate S. On the insulating film O, first electrodes $M_1$ are disposed in parallel and second electrodes $M_2$ are also disposed in parallel. The first electrodes $M_1$ are insulated from the second electrodes $M_2$ and the first electrodes $M_1$ and the second electrodes $M_2$ are disposed such that one side of a first electrode $M_1$ and one side of a second electrode $M_2$ are adjacent to each other. On the surface regions of the semiconductor substrate S between the respective other sides of the first electrodes $M_1$ and the second electrodes $M_2$, high concentration regions $S_3$ are formed using the first and second electrodes $M_1$ and $M_2$ as a mask without causing deviation in positioning. To the first electrodes $M_1$ and the second electrodes $M_2$, a first clock pulse $\phi_1$ and a second clock pulse $\phi_2$ are applied respectively and electric charges are transferred in response to these clock pulses.

1 Claim, 5 Drawing Figures (a)

(b)

(c)

(d)

(e)

(f)

CHARGE COUPLED DEVICE FOR TRANSFERRING ELECTRIC CHARGE

BACKGROUND OF THE INVENTION

1. Field of the Invention

The present invention relates to a charge coupled device and particularly to a charge coupled device such as a linear image sensor for use in a facsimile, an area image sensor for use in a still camera or a video camera and the like.

2. Description of the Prior Art

Charge coupled devices (hereinafter referred to as CCD) are utilized as various kinds of image sensors, which are roughly classified into two types to be utilized for a video camera: image sensors of a frame transfer system in which a CCD portion contains a photoelectric conversion portion, and image sensors of an interline transfer system in which a photoelectric conversion portion outside a CCD portion is coupled to the CCD portion. However, since such a CCD image sensor requires as many as approximately 200,000 photoelectric conversion elements, the demand for CCD of the frame transfer system having a simpler structure is so largely increasing these days that the frame transfer system is applied in most cases.

With a view to simplifying the structure and the operation of a CCD image sensor of the above described frame transfer system, a system called "Virtual Phase Technology" is proposed by Texas Instruments Inc. in U.S.A. (by J. Hynecek, in IEEE, Vol. ED-28, No. 5, May 1981). FIG. 1(a) shows a structure of electrodes of a CCD image sensor of such system and FIG. 1(b) shows a potential form thereof. Referring to FIG. 1(a), an oxide film O is formed on a P type silicon substrate S. On the oxide film O, a plurality of electrodes M, M, ... are disposed in parallel. In the surface regions of the semiconductor substrate S positioned between the respective electrodes M, high concentration regions $S_1$, $S_1$, ... are formed by ion implantation of a P type impurity having the same conductive type as that of the substrate S. In right half portions of the surface regions of the semiconductor substrate S under the respective electrodes M and in right half portions of the regions of the semiconductor substrate S under the respective high concentration regions $S_1$, well regions $S_2$, $S_2$, ... shown by the marks + are provided by ion implantation of an N type impurity having the conductive type opposite to that of the substrate S. Beforehand, on the whole surface layer of the substrate S, an N type impurity layer assigned for channel regions has been formed. On this N type impurity layer, high concentration regions are selectively formed and these high concentration regions become the well regions $S_2$, $S_2$, ...

As for the impurity concentrations of the respective portions, the impurity concentration of the substrate S is selected to be approximately $10^{15}/cm^3$, that of the N type impurity layer formed on the surface layer of the substrate S is selected to be approximately $10^{16}/cm^3$, that of the high concentration regions in this N type impurity layer, namely, the well regions $S_2$ is selected to be approximately $2\times10^{16}/cm^3$ and that of the P type high concentration regions $S_1$ is selected to be approximately $10^{20}/cm^3$, for example.

In a CCD of such structure, a clock pulse $\phi$ of one phase is applied to the respective electrodes M, while the high concentration regions $S_1$ in the surface regions of the semiconductor substrate S serve substantially as fixed potential electrodes, generating a potential form as shown in FIG. 1(b). More specifically, in FIG. 1(b), the solid lines represent potential at the time when the clock pulse $\phi$ is in the high level and the broken lines represent potential at the time when the clock pulse $\phi$ is in the low level. As can be seen from FIG. 1(b), a potential under each electrode M and a potential under each high concentration region $S_1$ as a fixed potential electrode are changed dependently on each well region $S_2$ in the right half portion thereunder so that a potential well deeper than the left half portion is formed. Accordingly, carriers captured in a potential well in each well region $S_2$ (namely, photoelectrically converted electrons in this case) are transferred successively to the potential well of the adjacent well region $S_2$ on the right so that these electrons are read out through an output amplifier (not shown).

Such a conventional CCD as described above has advantages such as simplicity of one phase of the driving pulse; however, since well regions $S_2$ need be selectively formed in advance under the respective electrodes M and under the respective high concentration regions $S_1$ for the purpose of determining the electric charge transfer direction, a drawback is involved that the manufacturing process thereof becomes complicated. For example, when electrodes M and high concentration regions $S_1$ are formed after well regions $S_2$ have been formed in the semiconductor substrate S by ion implantation, as shown in FIG. 2(a), the precision of mask alignment might be decreased, causing deviation in positioning. In such case, the potential form would be distorted as shown in FIG. 2(b) and the carriers could not be transferred.

On the other hand, with regard to a capacity for transferring carriers, namely, photoelectrically converted electrons, this capacity is determined by the smaller value out of the potential energy differences V and V' determined in advance by an ion implantation amount in each well region $S_2$. Accordingly, much inconvenience is caused in practical application since the operation conditions of such a CCD, as well as the conditions for selecting a photoelectric conversions amount in case of such a CCD serving as an image sensor, cannot be determined freely.

SUMMARY OF THE INVENTION

A principal object of the present invention is to provide a CCD in which regions substantially serving as electrodes can be formed by self-alignment without requiring mask alignment and a capacity for transferring carriers can be determined freely.

Briefly stated, the present invention comprises first electrodes provided on a semiconductor substrate through an insulating film, second electrodes also provided on the semiconductor substrate through the insulating film and impurity regions of high concentration provided in the specified surface regions of the semiconductor substrate, the first electrodes, the second electrodes and the impurity regions of high concentration being plural in number and arranged in an circulating manner.

According to the present invention, impurity regions of high concentration serving substantially as electrodes can be formed easily by self-alignment using the first and second electrodes as a mask without causing deviation in positioning.

Furthermore, according to the present invention, a charge transfer capacity can be determined freely by the voltage levels of the clock pulses to be applied to the first electrodes and the second electrodes.

In addition, according to the present invention, such well regions as required in a conventional CCD are not required and as a result, a CCD of the present invention can be made in a simple structure and in a small size.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
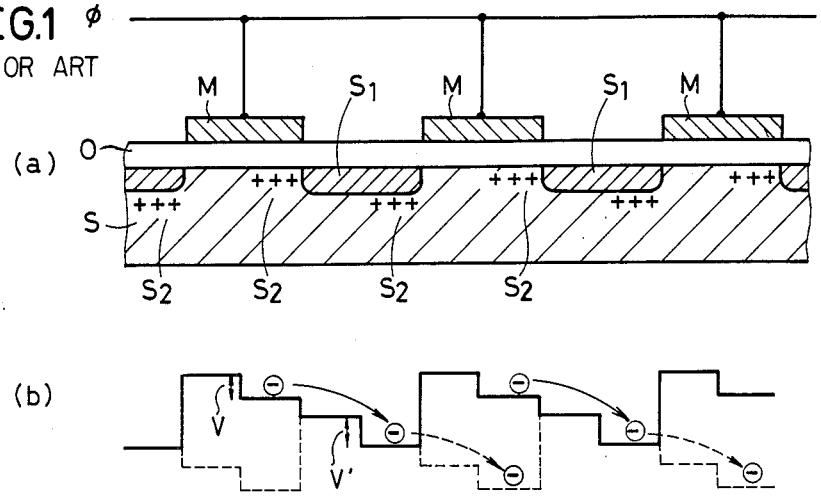
FIGS. 1(a) and 1(b) show respectively a sectional view of an example of a conventional CCD and a potential form thereof.
Figure 2:
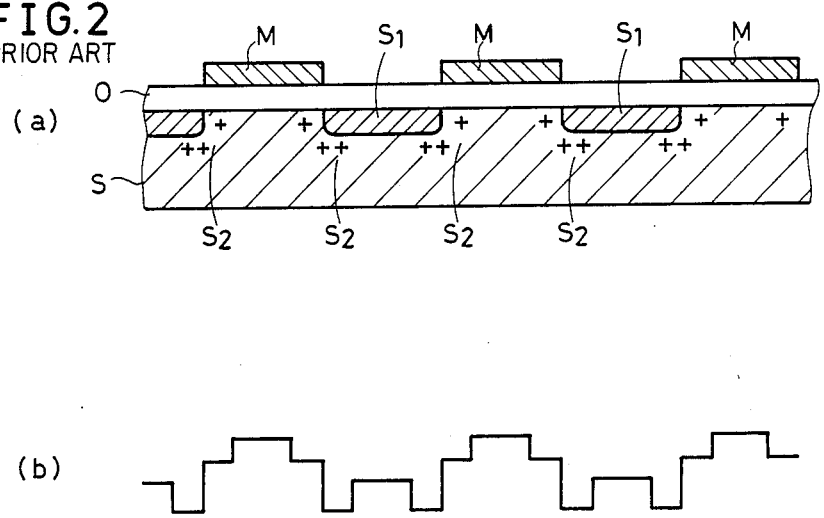
FIGS. 2(a) and 2(b) show respectively a sectional view of a conventional CCD and a potential form thereof for explaining drawbacks of the conventional CCD.
Figure 3A:
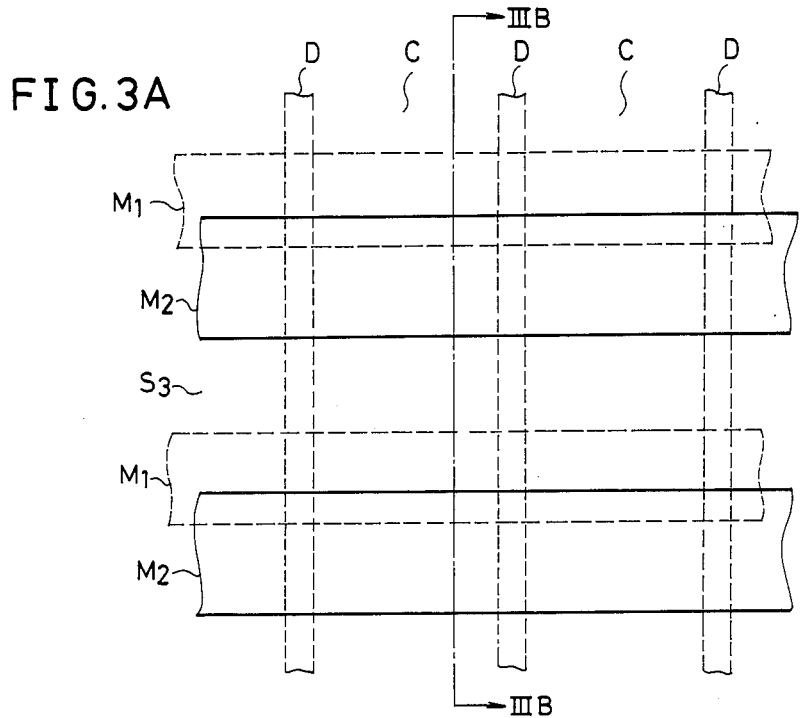
FIG. 3A is a plane view of a CCD of an embodiment in accordance with the present invention.
Figure 3B:
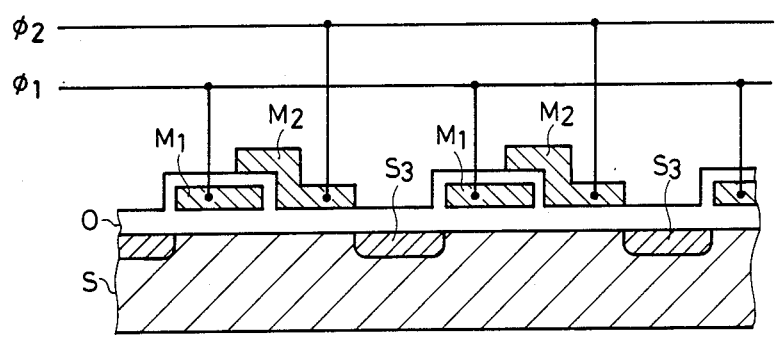
FIG. 3B is a sectional view of the CCD shown in FIG. 3A, taken along the line IIIB—IIIB.

FIG. 3A in a plane view of a CCD of an embodiment in accordance with the present invention. FIG. 3B is a sectional view of the CCD shown in FIG. 3A, taken along the line IIIB—IIIB. Referring to the drawings, an insulating film O is formed on a semiconductor substrate S. On the insulating film O, a plurality of first electrodes $M_1$, $M_1$, ... made of polysilicon for example are disposed in parallel at almost equal intervals. Also on the insulating film O, a plurality of second electrodes $M_2$, $M_2$, ... made of polysilicon for example are disposed in parallel in the same direction as in the first electrodes $M_1$. The second electrodes $M_2$ are disposed in a manner in which one side of each second electrode $M_2$ is superposed over one side of the adjacent first electrode $M_1$, and the respective adjacent electrodes of the first and second electrodes $M_1$ and $M_2$ are insulated from each other by the insulating film O. In the surface regions of the semiconductor substrate S positioned between the respective other sides of the first electrodes $M_1$ and the second electrodes $M_2$, high concentration regions $S_3$, $S_3$, ... serving substantially as third electrodes are formed. These high concentration regions $S_3$ are obtained by ion implantation of an impurity of the same conductive type as that of the semiconductor substrate S, for example, boron of the P type, using the first and second electrodes $M_1$ and $M_2$ as a mask, without causing deviation in positioning. The channel stoppers D formed in a direction perpendicular to the first and second electrodes $M_1$ and $M_2$ serve to separate the parallel channel portions of the CCD. Though not shown in FIG. 3B, an N type impurity layer serving as channel regions is formed on the surface layer of the semiconductor substrate S.

As for the impurity concentrations of the respective portions, the impurity concentration of the substrate S is selected to be approximately $10^{15}/cm^3$, that of the N type impurity layer as channel regions on the surface layer of the substrate S is selected to be approximately $10^{16}/cm^3$ and that of the P type high concentration regions $S_3$ is selected to be approximately $10^{20}/cm^3$, for example.

In the above described CCD, the high concentration regions are grounded in the same potential as in the semiconductor substrate S as shown in FIG. 3B, so that the regions $S_3$ serve substantially as fixed potential electrodes. A first clock pulse $\phi_1$ is applied to the first electrodes $M_1$, while a second clock pulse $\phi_2$ is applied to the second electrodes $M_2$.

FIGS. 4(a) to 4(e) are diagrams showing changes in the potential form of the CCD shown in FIGS. 3A and 3B. FIG. 4(f) shows a sectional view of the CCD for explaining the left and right positional relation thereof for information.

Figure 4:
FIGS. 4(a) to 4(e) are diagrams showing changes in the potential form of the CCD shown in FIG. 3A and FIG. 3B
FIG. 4(f) shows a sectional view of the CCD in the same manner as in FIG. 3B, for explaining positional relation for information.
Figure 4:
Figure 4:
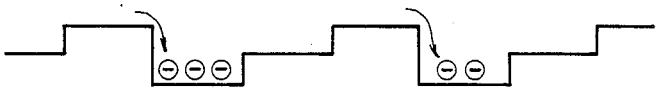
Figure 4:
Figure 4:
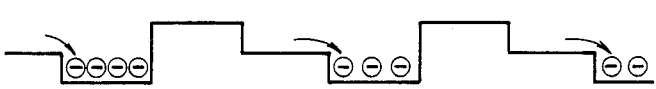
Figure 4:
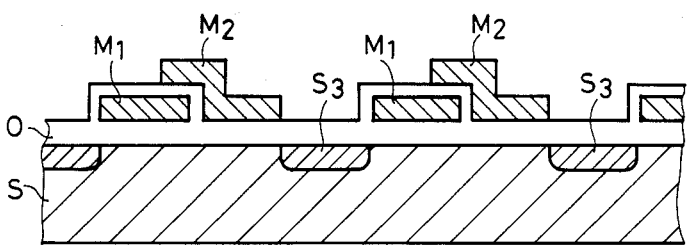

Now, the operation of the above described embodiment will be described in detail with reference to the potential diagrams of FIG. 4(a) to 4(e). When the clock pulse $\phi_1$ and the clock pulse $\phi_2$ are in the high level and in the low level, respectively, potential wells are formed in the positions of the first electrodes $M_1$ as shown in FIG. 4(a), and electrons as carriers excited by the light incident on the CCD in this state, namely, in a photoelectric conversion period are stored in these potential wells. Then, when the clock pulses $\phi_1$ and $\phi_2$ are respectively in the high level, the potential wells where electrons are stored are extended as far as the positions of the second electrodes $M_2$ continuous with the positions of the first electrodes $M_1$, as shown in FIG. 4(b). Subsequently, when the clock pulses $\phi_1$ and $\phi_2$ are in the low level and in the high level respectively, the potential wells where electrons are stored are made small to correspond only to the positions of the second electrodes $M_2$, as shown in FIG. 4(c). Subsequently, when the clock pulses $\phi_1$ and $\phi_2$ are respectively in the low level, potential wells are formed in the positions of the high concentration regions $S_3$ as shown in FIG. 4(d) and as a result, the electrons stored till then in the potential wells in the positions of the adjacent second electrodes $M_2$ on the left are transferred to the newly formed potential wells. Then, when the clock pulses $\phi_1$ and $\phi_2$ are in the high level and in the low level, respectively, electrons are transferred to the potential wells in the positions of the first electrodes $M_1$, as shown in FIG. 4(e) in the same manner as in FIG. 4(a). Subsequently, the potential changes as shown in FIGS. 4(a) to 4(e) are repeated cyclically and thus, electrons are transferred from the left to the right so as to be supplied to the exterior as a picture signal.

By suitably regulating the voltage levels of the clock pulses $\phi_1$ and $\phi_2$, the charge transfer capacity can be determined freely.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A charge coupled device for transferring electric charges successively in response to first and second clock pulses, comprising:
   a semiconductor substrate, an insulating film formed on said semiconductor substrate, a plurality of first electrodes disposed in parallel at almost equal intervals on said insulating film and each having a first and second edge, a plurality second electrodes disposed in parallel on said insulating film and each having a first and second edge, the first edge of each of said second electrodes being in partial overlapping relationship with the first edge of one of said first electrodes and being insulated therefrom, the second edges of said first and second electrodes being free of overlap with and spaced from any other electrode, and impurity regions of high concentration of the same conductive type as that of said semiconductor substrate, formed respectively in a surface region of said semiconductor substrate in a space between the second edges of a first electrode and said second electrode which do not overlap, means for coupling said first clock pulse to each of said first electrodes, and means for coupling said second clock pulse to each of said second electrodes.

* * * * *